United States Patent
Kim

(10) Patent No.: US 8,802,973 B2
(45) Date of Patent: Aug. 12, 2014

(54) SOLAR BATTERY AND METHOD FOR MANUFACTURING THE SAME

(75) Inventor: Kyung Am Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 71 days.

(21) Appl. No.: 13/379,885

(22) PCT Filed: Nov. 2, 2010

(86) PCT No.: PCT/KR2010/007649
§ 371 (c)(1),
(2), (4) Date: Dec. 21, 2011

(87) PCT Pub. No.: WO2011/055954
PCT Pub. Date: May 12, 2011

(65) Prior Publication Data
US 2012/0204929 A1     Aug. 16, 2012

(30) Foreign Application Priority Data
Nov. 3, 2009   (KR) .......................... 10-2009-0105421

(51) Int. Cl.
| | | |
|---|---|---|
| H01L 31/05 | (2014.01) | |
| H01L 31/0749 | (2012.01) | |
| H01L 31/042 | (2014.01) | |
| H01L 31/0224 | (2006.01) | |
| H01L 27/142 | (2014.01) | |

(52) U.S. Cl.
CPC .... *H01L 31/022425* (2013.01); *H01L 31/0749* (2013.01); *Y02E 10/541* (2013.01); *H01L 31/042* (2013.01); *H01L 27/1426* (2013.01); *H01L 27/1423* (2013.01)
USPC ......................................... 136/258; 136/252

(58) Field of Classification Search
CPC . H01L 31/0368; H01L 31/0376; H01L 31/05; H01L 31/0512; H01L 27/1426; H01L 27/302
USPC .......................... 136/206, 242, 244, 252, 258
See application file for complete search history.

(56) References Cited

U.S. PATENT DOCUMENTS

| | | | |
|---|---|---|---|
| 2003/0075211 A1* | 4/2003 | Makita et al. .................. | 136/244 |
| 2003/0172967 A1* | 9/2003 | Tachibana et al. ............. | 136/244 |
| 2005/0253142 A1 | 11/2005 | Negami et al. | |
| 2006/0283496 A1* | 12/2006 | Okamoto et al. ............. | 136/244 |
| 2009/0217966 A1 | 9/2009 | Eo et al. | |
| 2009/0229596 A1 | 9/2009 | Shin et al. | |
| 2009/0314337 A1* | 12/2009 | Lee et al. ...................... | 136/255 |
| 2010/0006865 A1 | 1/2010 | Nakata | |

(Continued)

FOREIGN PATENT DOCUMENTS

| | | |
|---|---|---|
| CN | 101507001 A | 8/2009 |
| JP | 58-048474 | 3/1983 |

(Continued)

OTHER PUBLICATIONS

Supplementary European Search Report dated Mar. 28, 2014 in European Application No. 10-82-8489.

*Primary Examiner* — Susan D Leong
(74) *Attorney, Agent, or Firm* — Saliwanchik, Lloyd & Eisenschenk

(57) ABSTRACT

A solar battery according to the embodiment of the present invention comprises a plurality of solar battery cells formed on a first area of a substrate to include a rear electrode pattern, a light-absorbing layer, a buffer layer and a front electrode layer respectively; a metal film pattern formed on a second area of the substrate to electrically connect to each a plurality of solar battery cells and space each other; and a connection unit formed between the mutually spaced metal film patterns.

9 Claims, 9 Drawing Sheets

(56) References Cited

U.S. PATENT DOCUMENTS

| | | | |
|---|---|---|---|
| 2010/0218827 A1* | 9/2010 | Aono et al. | 136/264 |
| 2012/0060895 A1* | 3/2012 | Rubin et al. | 136/246 |

FOREIGN PATENT DOCUMENTS

| | | |
|---|---|---|
| JP | 58-048475 A | 3/1983 |
| JP | 2003-124484 A | 4/2003 |
| JP | 2004-103959 A | 4/2004 |
| JP | 2009-527123 A | 7/2009 |
| KR | 10-2009-009777 A | 9/2009 |
| KR | 10-2009-0097777 A | 9/2009 |
| KR | 10-2010-0095928 A | 9/2010 |
| WO | WO-2009-018016 A2 | 2/2009 |
| WO | WO-2009-057951 A2 | 5/2009 |

* cited by examiner

SOLAR BATTERY AND METHOD FOR MANUFACTURING THE SAME

CROSS-REFERENCE TO RELATED APPLICATIONS

This application is the U.S. national stage application of International Patent Application No. PCT/KR2010/007649, filed Nov. 2, 2010, which claims priority to Korean Application No. 10-2009-0105421, filed Nov. 3, 2009, the disclosures of each of which are incorporated herein by reference in their entirety.

BACKGROUND OF THE INVENTION

1. Technical Field

The present invention relates to a solar battery and a method for manufacturing the same.

2. Description of the Related Art

Recently, as demand for energy increases, a solar battery for converting solar-light energy into electric energy has been developed.

In particular, a CIGS-base solar battery, which is a hetero junction device of a structure including a glass substrate, an metal-back-electrode layer, an p-type CIGS-base-light absorbing layer, an high-resistance buffer layer, an n-type window layer and the like has been widely used.

Such a solar battery has a panel in which a plurality of cells is formed and is connected to use in series.

When any one poor cell of the plurality of cells is damaged, this panel may not be used and discarded.

SUMMARY OF THE INVENTION

The embodiment of the present invention is to provide a solar battery and a method for manufacturing the same capable of using a poor battery as the solar battery.

A solar battery according to the embodiment of the present invention includes a plurality of solar battery cell formed on a first area of a substrate to include a rear electrode pattern, an light-absorbing layer, an buffer layer and an front electrode layer respectively; a metal film pattern formed on a second area of the substrate to electrically connect to the plurality of solar battery cells and space each other; and a connection unit formed between the mutually spaced metal film pattern.

A method for manufacturing a solar battery according to the embodiment of the present invention includes; forming a plurality of a rear electrode pattern on a first area in a substrate to space apart from each other and connecting each rear electrode pattern to an area on the substrate to form a plurality of mutually spaced metal film patterns on an second area in the substrate; forming as buffer layer and the light absorbing layer on the first area of the substrate having the rear electrode pattern in order; forming a contact pattern passing through the buffer layer and the light absorbing layer; forming an upper a front electrode on the buffer layer and the light absorbing layer having the contact pattern and then exposing a portion of the rear electrode pattern through the buffer layer, the light absorbing layer and the upper front electrode and forming a separation pattern separating as a unit cell; connecting electrically the rear electrode pattern of a poor cell area of the solar electrode cells which is formed on a second area of the substrate; and forming the rear electrode pattern, the light absorbing layer, the buffer layer and the front electrode layer on the first area, and forming the metal film pattern and the crystalline pattern on the second area.

DESCRIPTION OF THE PREFERRED EMBODIMENTS

Figure 1:
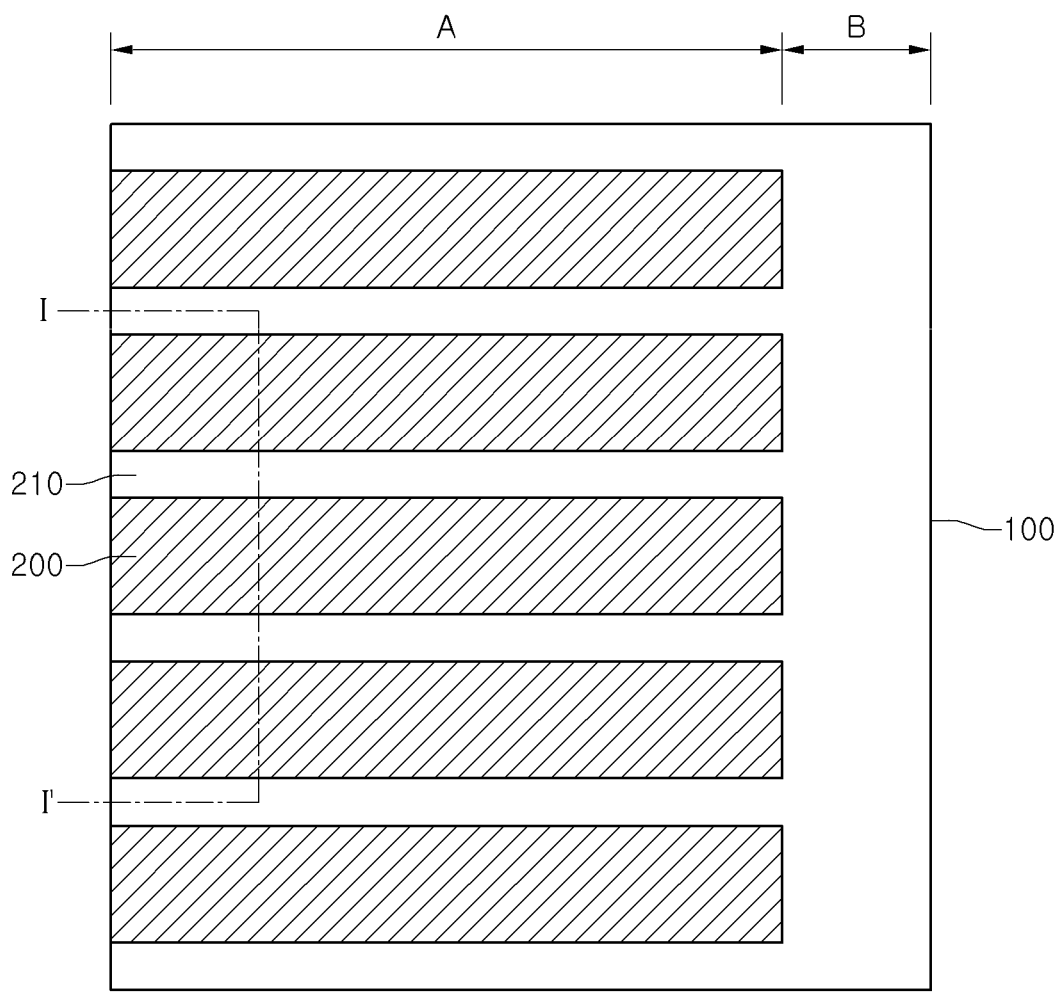
FIGS. 1 to 12 is a cross-sectional view and a plan view showing a manufacturing a process of a solar battery according the embodiment of the present invention.

In the embodiment of the present invention, in case that each substrate, an layer, a film, electrode and the like is formed "on" or "under" each substrate, the layer, the film or the electrode, "on" and "under" mean including "directly" or "indirectly" through other components. In addition, a criteria of "top" and "bottom" will be described based on the drawings. A size of each component in the drawings may be exaggerated for clear description and does not means the size actually applied thereto.

Figure 10:
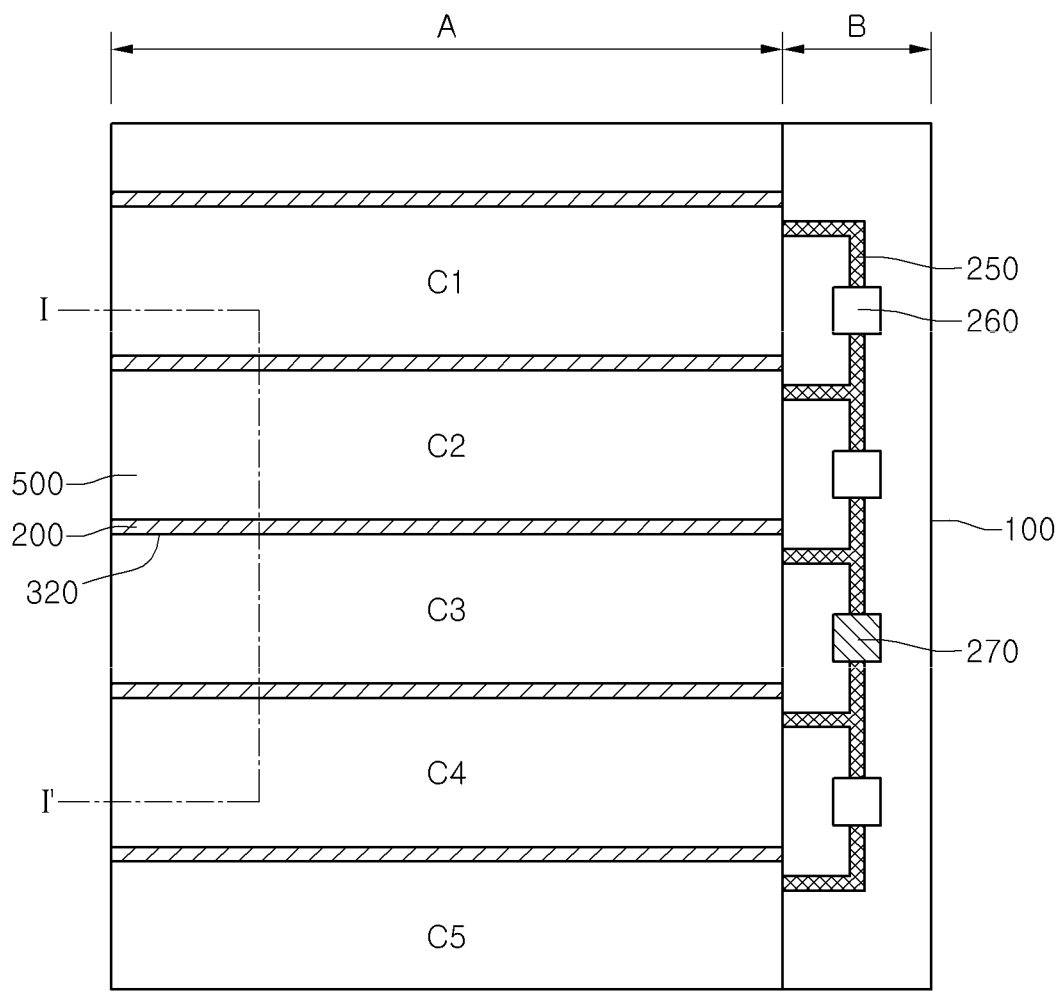

FIG. 10 is a cross-sectional view showing a solar battery according to the embodiment of the present invention.

The solar battery according to the embodiment of the present invention includes a plurality of cells C1, C2, C3, C4, C5, a metal film pattern 250 and a crystalline pattern.

The solar battery cells C1, C2, C3, C4, C5 include a rear electrode pattern 200, a light absorbing layer, a buffer layer and a front electrode layer 500, which are included in an area A.

The metal film pattern 250 is formed in an second area B and is connected to each rear electrode pattern.

Between the metal patterns 250, an amorphous pattern 260 and a crystalline pattern 270 is disposed. When the third cell is a poor cell, the crystalline pattern 270 is formed only between the metal film patterns corresponding to the poor cell.

The metal film pattern 250 adjacent to the amorphous pattern 260 is not electrically connected to each other, while the metal film pattern 250 adjacent to the crystalline pattern 270 is electrically connected to each other, so that a different rear pattern 200 can be electrically connected.

That is, the metal film pattern 250 may connect the rear electrode pattern 200 in the poor cell area and the rear electrode pattern 200 of the cell adjacent to the poor cell.

Figure 11:
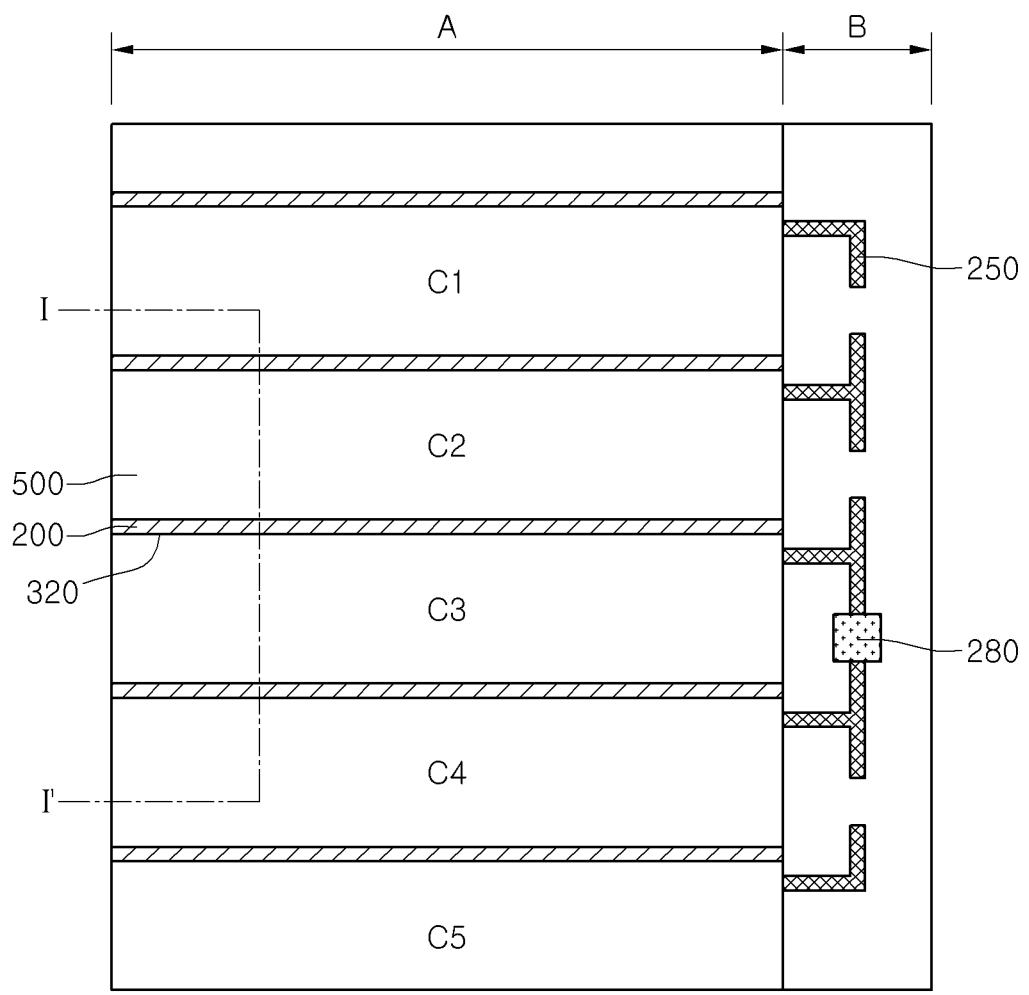

In the embodiment, even if the crystalline pattern 270 may be disposed between the metal film patterns 250 to electrically connect the rear electrode pattern 200 of the poor cell area, a conductive material 280 may be disposed between the metal film patterns 250 as shown FIG. 11.

That is, as shown in FIG. 11, an area between the metal film patterns 250 corresponding to a normal cell area maintain in its original condition, while the conductive material 280 may be disposed only between the metal film pattern 250 corresponding to the poor cell area.

In this case, the conductive material 280 may be made of conductive paste or conductive tape.

The conductive paste may be silver (Ag) paste and the conductive tape may be carbon tape.

As described below, the solar battery will be described in detail according to a manufacturing process of the solar battery.

FIGS. 1 to 12 are a cross section showing the manufacturing process of the solar battery according the embodiment of the present invention.

Figure 2:
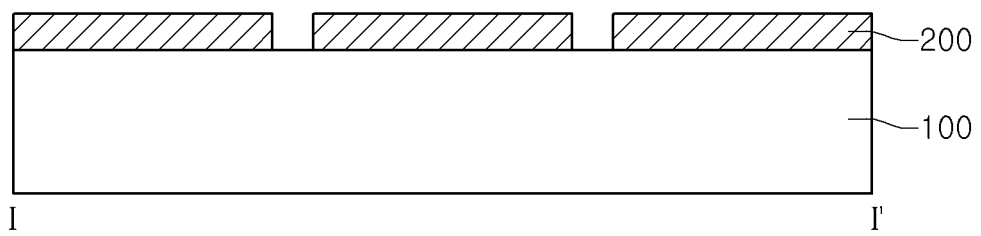

First, the rear electrode pattern 200 is formed on the first area A on the substrate 100 as shown in FIG. 1 and FIG. 2.

The substrate 100 may be made of glass, a ceramic substrate such as alumina, a stainless steel substrate, a titanium substrate or a polymer substrate and the like may also be used.

Sodalime glass may be used as a glass substrate and polyimide may be used as a polymer substrate.

In addition, the substrate 100 may be rigid or flexible.

The rear electrode pattern 200 may be formed as a conductor such as metal and the like and may be formed by pattering after forming the conductive material.

In this case, the rear electrode pattern 200 may be formed by forming a groove 210 in the rear electrode film and pattering the rear electrode pattern having the groove.

For example, the rear electrode pattern 200 may be formed using molybdenum Mo target by a sputtering process.

This is why molybdenum (Mo) has high electrical conductivity, ohmic junction with the light absorbing layer and high temperature stability under Se atmosphere.

In addition, but the rear electrode pattern 200 is not shown in the drawings, the rear electrode pattern may be formed as at least one layers.

When the rear pattern 200 is formed as a plurality of layers, a layer including the rear electrode pattern 200 may be made of different material.

In the embodiment, the rear electrode pattern 200 is formed in stripe form but is not limited to, and may form in a matrix form or in various forms.

Figure 3:
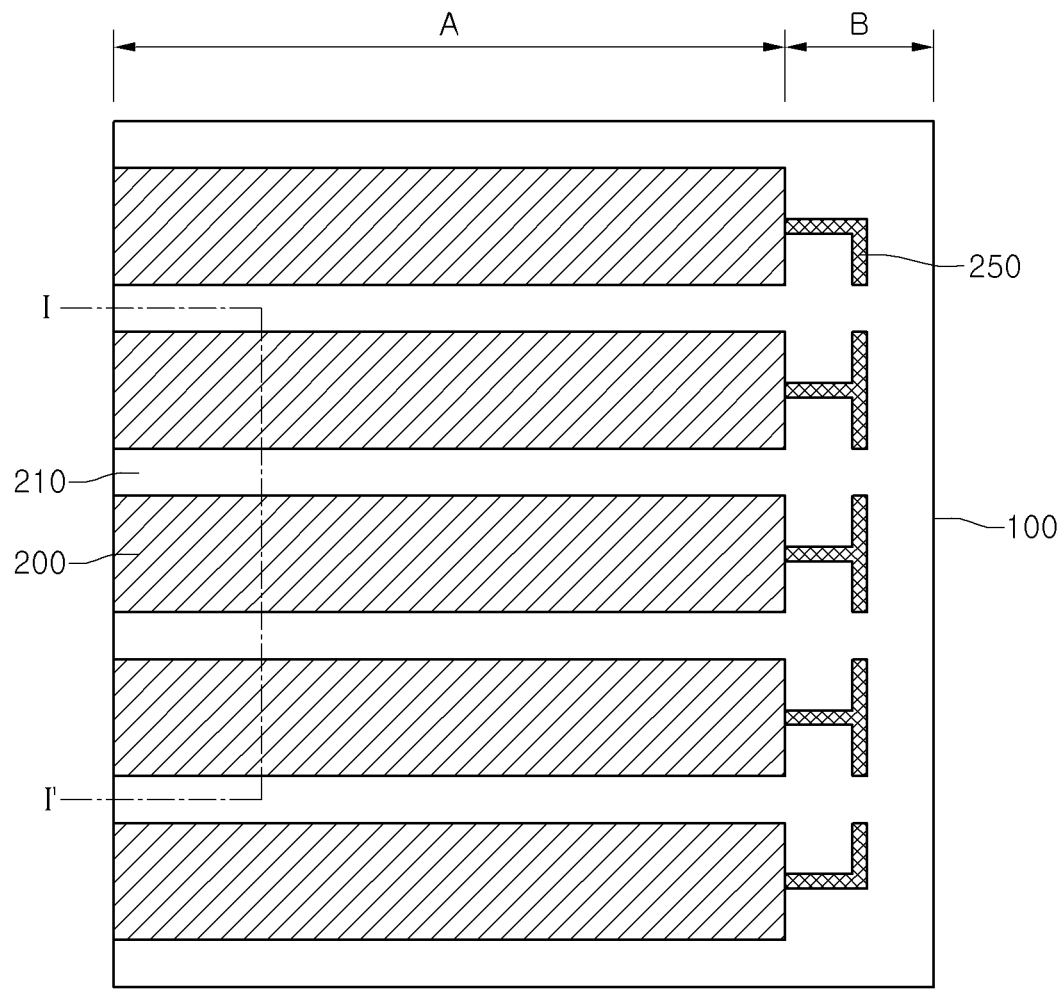

Subsequently, as shown in FIG. 3, the metal film 250 is formed in the second area B of the substrate 100.

In this case, the metal film pattern 250 may be formed every the rear electrode pattern 200 and the metal film pattern 250 and the rear electrode 200 may be electrically connected.

The each metal film pattern 250 connected to the rear electrode pattern 200 is formed spaced apart from each other.

That is, even if the rear electrode pattern 200 is electrically connected, the metal film patterns 250 are formed spaced apart from each other, so that they are not connected.

The metal film pattern 250 is made of aluminum (Al), copper (Cu) and the like.

Figure 4:
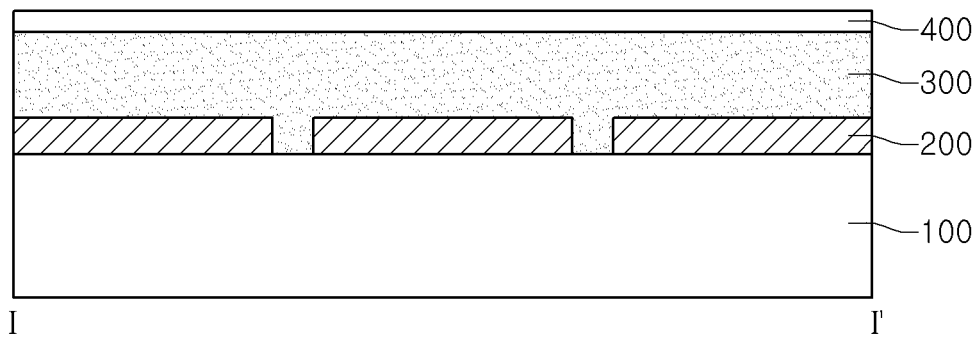
Figure 5:
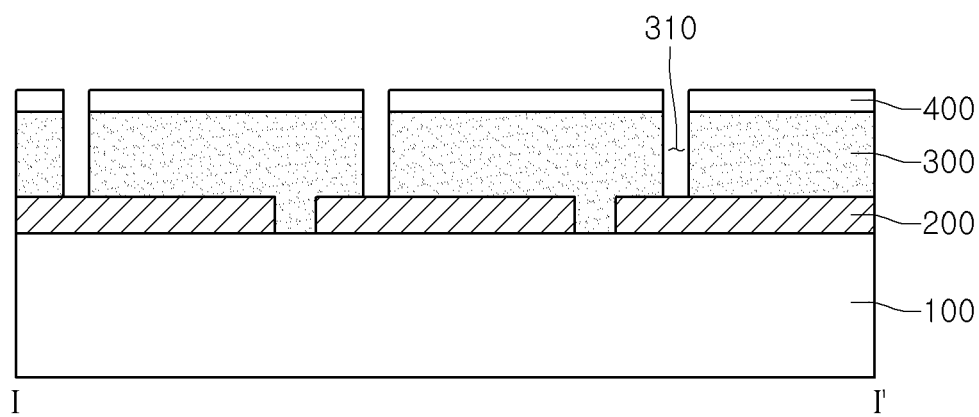
Figure 6:
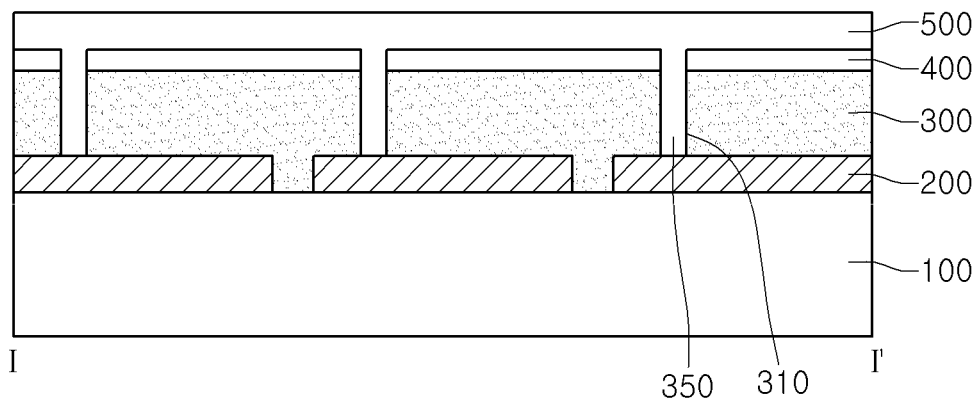

Subsequently, as shown in FIG. 4, the light absorbing 300 and a buffer layer 400 is formed on the rear electrode pattern 200.

In this case, the light absorbing layer 300 and the buffer layer 400 may be formed only on the first area A.

The light absorbing layer 300 may be made of Ib-III-VI-base-compound.

In more detail, the light absorbing layer 300 contains copper-indium-gallium-selenide-baseCu(In,Ga)Se2, CIGS-base compound.

In this contrast, the light absorbing layer 300 may contains cooper-indium-selenide-base-compound CuInSe2, CIS base or copper-gallium-selenide-base CuGaSe2, CIS base compound.

For example, in order to form the light absorbing layer 300, a CIG-base-metal precursor film is formed on the rear electrode pattern 200 using a copper target, an indium target and a gallium target.

Subsequently, the metal precursor film reacts with selenium Se to form a CIGS-base light absorbing layer 300 using a selenization process.

In addition, during the process for forming the metal precursor film and the selenization process, a alkali component contained in the substrate 100 is diffused over the metal precursor film and the light absorbing layer 300 through the rear electrode pattern 200.

An alkali component improves size of grain of the light absorbing layer 300 and crystallinity.

In addition, the light absorbing layer 300 may forms copper, indium, gallium, selenide Cu, In, Ga, Se using co-evaporation deposition method.

The light absorbing layer 300 receives an incident light from outside and converse the light into electrical energy. The light absorbing layer 300 generates light electromotive force by a photoelectric effect.

The buffer layer 400 is formed as at least one layers and may be formed on the substrate having the rear electrode pattern by any one or stacked layers of cadmium sulfide Cds, ITO, ZnO, and i-Zn O.

The buffer layer 400 may be formed as a transparent electrode.

In this case, the buffer layer 400 is an n-type semiconductor layer and the light absorbing layer 300 is a p-type semiconductor layer. Thus, the light absorbing layer 300 and the buffer layer 400 form a p-n junction.

In other words, the buffer layer 400 in the middle of two materials may be inserted to form a good junction because the light absorbing layer 300 and the front electrode 500 have a significant size of difference of an energy band gap and a lattice constant.

In the embodiment, one buffer layer is formed on the light absorbing layer, but is not limited to, and the buffer layer may be formed as two one more layers.

In addition, the contact pattern 310 passing through the light-absorbing layer 300 and the buffer layer 400 is formed.

The contact pattern 310 may be formed by a mechanical method or laser irradiation, so that a portion of the rear electrode pattern is exposed by forming the contact pattern 310.

Subsequently, a transparent conductive material is laminated on the buffer layer 400 to form the front electrode 500 and connection wiring 350.

In this case, the front electrode 500 may be also formed only on the area A.

When the transparent conductive material is laminated on the buffer layer 400, the transparent conductive material is also inserted into the contact pattern to form connection wiring 350.

The rear electrode 200 and the upper-front electrode 500 are electrically connected by connection wiring 350.

The front electrode 500 is formed by aluminum-doped zinc oxide by performance of the sputtering process on the substrate.

The upper front electrode 500 is a window performing a p-n junction on the light absorbing, wherein the upper electrode layer serves as a function of the transparent electrode of a front surface of the solar battery to be formed as zinc oxide ZnO having a high light transmittance and high electric conductivity.

In this case, the electrode having a low resistance may be formed by doping aluminum on zinc oxide.

A zinc oxide thin film that is the upper front electrode may be formed by a method for depositing using ZnO target RF by a sputtering method, a reactive sputtering using Zn target and a metal-organic chemical vapor deposition method.

In addition, ITO (Indium tin Oxide) thin film having an excellent electro-optical characteristics may be formed as a double structure deposited on zinc oxide thin film.

Figure 7:
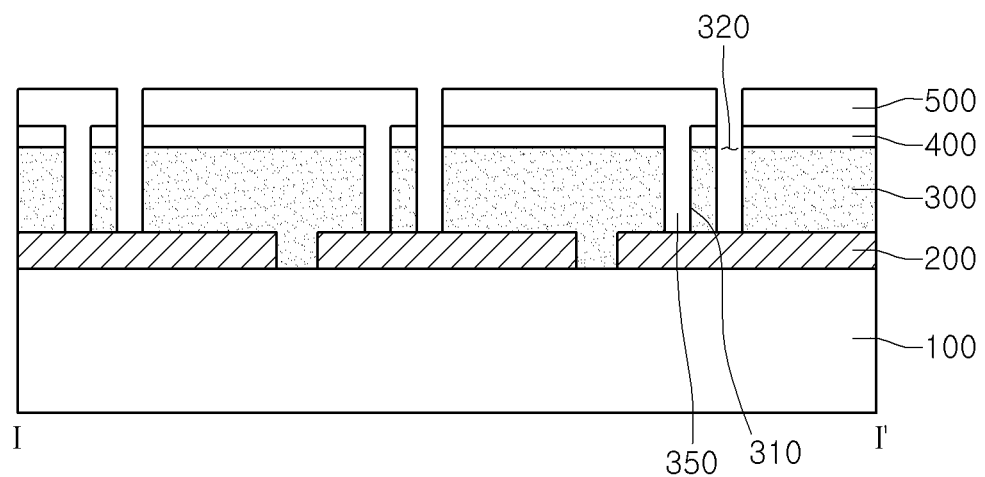
Figure 8:
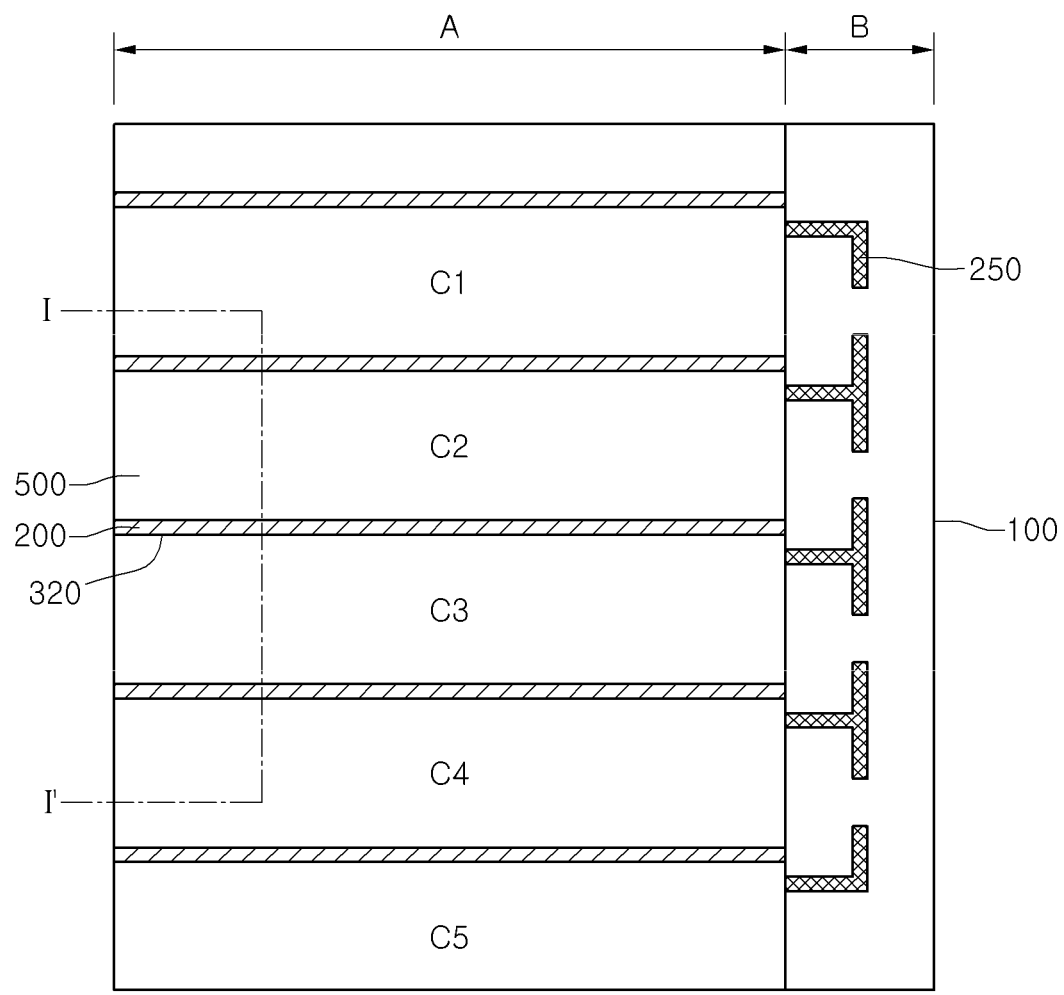

Furthermore, a separation pattern 320 passing through the light-absorbing layer 300 and the buffer layer 400 is formed as shown in FIG. 7 and FIG. 8.

The separation pattern 320 may be formed by the mechanical method or laser irradiation, so the upper surface of the rear electrode pattern may be exposed.

The buffer layer 400 and the upper are divided each other by the separation layer 320.

The buffer layer 400 and the light absorbing layer 300 may be disposed in a striped form or a metric form by the separation pattern 320.

The separation pattern 320 is not limited to the form and may be formed as various forms.

The cells (C1, C2, C3, C4 and C5) including the rear electrode pattern 200, the light absorbing layer 300, the buffer layer 400 and the front electrode 500 are formed by the separation pattern 320.

In this case, each cell C1, C2, C3, C4 and C5 is connected to each other by the connection wiring 350.

That is, the connection wiring 350 electrically connects the rear electrode pattern 200 of a third cell C3 and the front electrode 500 of the second cell C2 adjacent to the third cell C3.

In addition, the connection wiring 350 connects the rear electrode pattern 200 of a fourth cell C4 and the front electrode 500 of the third cell C3 adjacent to the fourth cell C4.

In addition, it is checked whether the poor cells C1, C2, C3, C4 and C5 occur with respect to the plurality of solar cells separated by the separation pattern 320.

The check for the poor cells is made by applying a thermal imaging cameras and the like to a panel in which the solar cells C1, C2, C3, C4 and C5 are formed.

When the third cell C3 is the poor cell, a load against the third cell C3 become bigger to generate overheat and the second cell C2 and the fourth cell C4 are not connected to each other.

Figure 9:
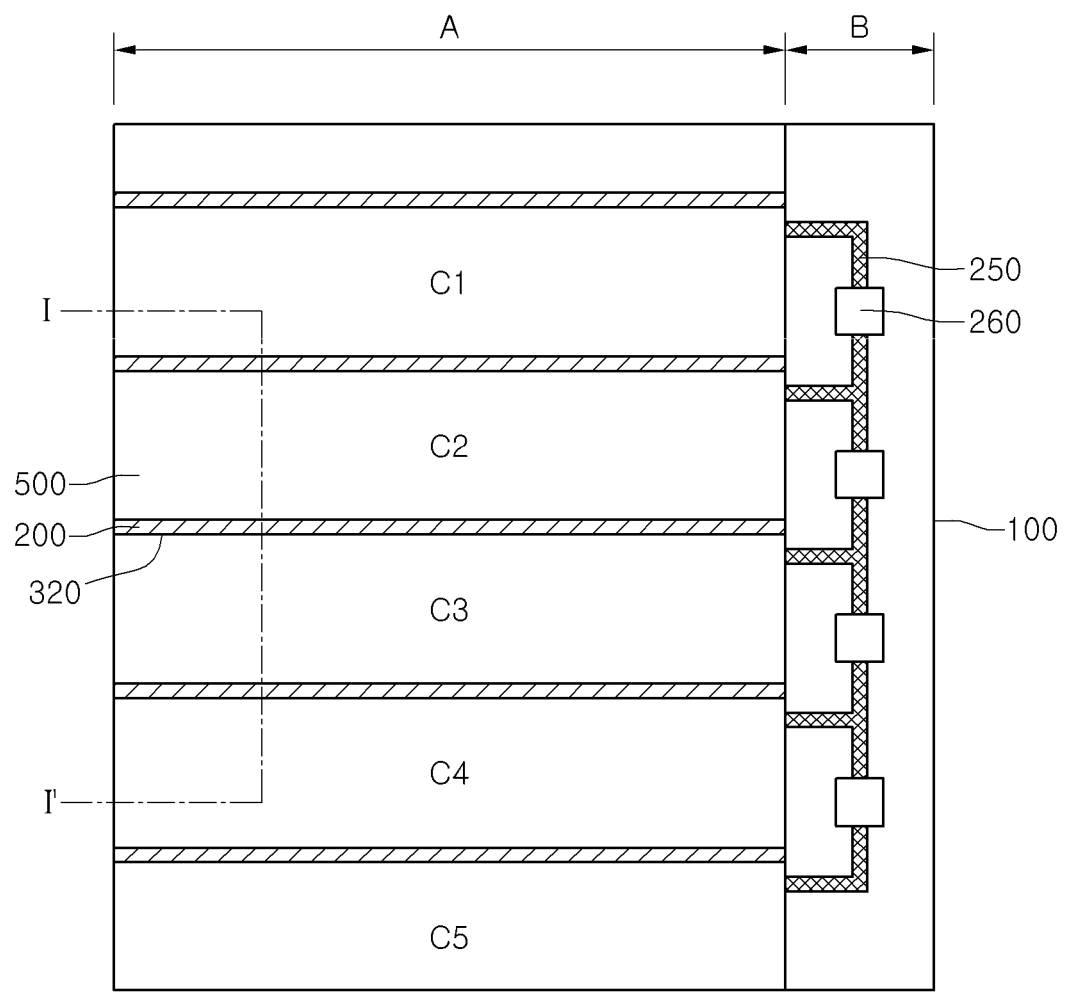

Next, the amorphous pattern 260 is formed between the metal film patterns 250 so as to for the metal pattern 250 to be connected to each other as shown in FIG. 9.

The metal film pattern 250 as the amorphous pattern 260 has the structure connected to each other, but is not electrically connected to the amorphous pattern 260.

The amorphous pattern 260 may be made of Ge2Sb2Te5 of group V and group VI compound. In addition, as illustrated in FIG. 10, the rear electrode pattern 200 adjacent to the third C3 and the fourth cell C4 is electrically connected to form the crystalline pattern 270 between the rear electrode patterns 200 corresponding to thereto.

The crystalline pattern 270 can be changed to the amorphous pattern 260 selected from progress of the laser process to the amorphous pattern corresponding thereto. That is, the amorphous pattern 260 formed between the metal film patterns 250 connected to the rear electrode pattern 200 of the third cell C3 and cell C4 is changed to the crystalline pattern 270 to electrically connect the rear electrode pattern 200 of the third cell C3 and fourth cell C4.

In the embodiment of the present invention, the amorphous pattern 260 of the area corresponding to the poor cell is changed to the crystalline pattern, but is limited to, and as shown in FIG. 11, the metal film pattern 250 in the area corresponding to the poor cell may be connected by the conductive material 280.

After checking the poor cell, the area corresponding thereto may be electrically connected to the rear electrode pattern 200 directly adjacent to the conductive material 280.

In this case, the conductive material 280 may be made of conductive paste or conductive tape.

The conductive paste may be silver (Ag) paste and the conductive tape may be cupper (Cu) or carbon tape.

Figure 12:
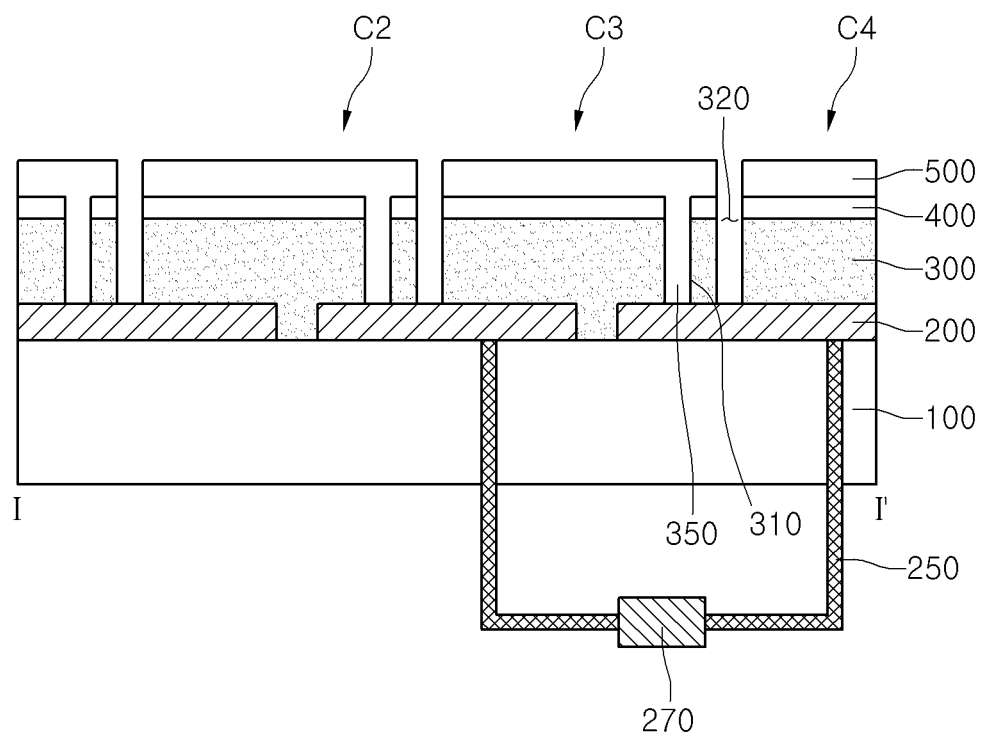

FIG. 12 illustrates a simple structure to which a third C3 and a fourth C4 is connected.

That is, the rear electrode pattern 200 of the third cell C3 and the rear electrode pattern 200 of the fourth C4, which are the poor cell, are electrically connected by the metal film pattern 250 and the crystalline pattern 270 and the second cell C2 and the fourth C4 connected to the third cell C3 are connected electrically.

The embodiment was described when only the third cell C3 is poor, but may includes at least one or more poor cells.

For example, when both second C2 and third C3 are poor, the amorphous pattern 260 corresponding to the third cell C3 and the fourth cell C4 is may be crystallized so as to connect the rear electrode pattern 200 of the fourth cell C4 and the rear electrode pattern 200 of the second cell C2.

Therefore, the poor cell may use as the solar cell by connecting the cells adjacent to the poor cell areas each other without throwing the poor even if the poor cells in the cell of solar battery occur.

A solar battery and a method for manufacturing the same according to the embodiment of the present invention can use a poor cell by connecting the cells adjacent to the poor cell areas each to other without throwing the poor cell even if the poor cell occurs.

It is appreciated that the present invention can be carried out in other specific forms without changing a technical idea or essential characteristics by one having ordinary skilled in the art to which the present invention pertains to. Therefore, embodiments described above are for illustration purpose in all respect but not limited to them. The scope of the present invention is represented by claims described below rather than the detailed description, and any change and variations derived from the meaning, the scope and the concept of equality of claims should be interpreted to be included to the scope of the present invention.

In addition, although the preferred embodiments of the present invention are shown and described above, the present invention is not limited to above-described specific embodiment and is variously modified by one skilled in the art without the gist of the present invention claimed in the claim, such that the modified embodiment is not to be understood separately from technical ideas or views of the present invention.

What is claimed is:

1. A solar battery comprising:
    a plurality of solar battery cells formed on a first area of a substrate to include a rear electrode pattern, a light-absorbing layer, a buffer layer and a front electrode layer, respectively;
    a plurality of metal film patterns formed on a second area of the substrate to electrically connect to the plurality of solar battery cells; and
    a connection unit formed between the metal film patterns, wherein the metal patterns are separated from each other, wherein the connection unit includes an amorphous pattern and a crystalline pattern.

2. The solar battery of claim 1, wherein the metal film patterns are electrically connected to the rear electrode pattern of the plurality of solar battery cells.

3. The solar battery of claim 1, wherein the crystalline pattern is connected electrically to the metal film pattern connected to a poor cell area of the plurality of solar battery cells.

4. The solar battery of claim 3, wherein the connection unit in contact with the metal film pattern corresponding to the poor cell area of the plurality of solar battery cells includes a conductive material and the conductive material is conductive paste or conductive tape.

5. The solar battery of claim 4, wherein the conductive paste includes silver paste, and the conductive tape includes copper or carbon.

6. The solar battery of claim 1, wherein the metal film pattern contains Al or Cu.

7. The solar battery of claim 1, wherein the amorphous pattern contains Ge2Sb2Te5.

8. The solar battery of claim 1, wherein the front electrode layer is electrically connected to the rear electrode pattern.

9. The solar battery of claim 1, further including a connection wiring electrically connecting the rear electrode pattern of one cell of the plurality of solar battery cells and the front electrode of a cell adjacent to the one cell.

* * * * *